Feb. 7, 1950 M. WALLACE 2,496,832

RADIO RECEIVING SYSTEM WITH AUTOMATIC TUNER

Filed July 18, 1946

INVENTOR.
MARCEL WALLACE
BY Hyman Hurvitz

Patented Feb. 7, 1950 2,496,832

UNITED STATES PATENT OFFICE 2,496,832

RADIO RECEIVING SYSTEM WITH AUTOMATIC TUNER

Marcel Wallace, East Port Chester, Conn., assignor, by mesne assignments, of one-half to Panoramic Radio Corporation, New York, N. Y., a corporation of New York Application July 18, 1946, Serial No. 684,630

15 Claims. (Cl. 250—20)

Figures 1, 2:
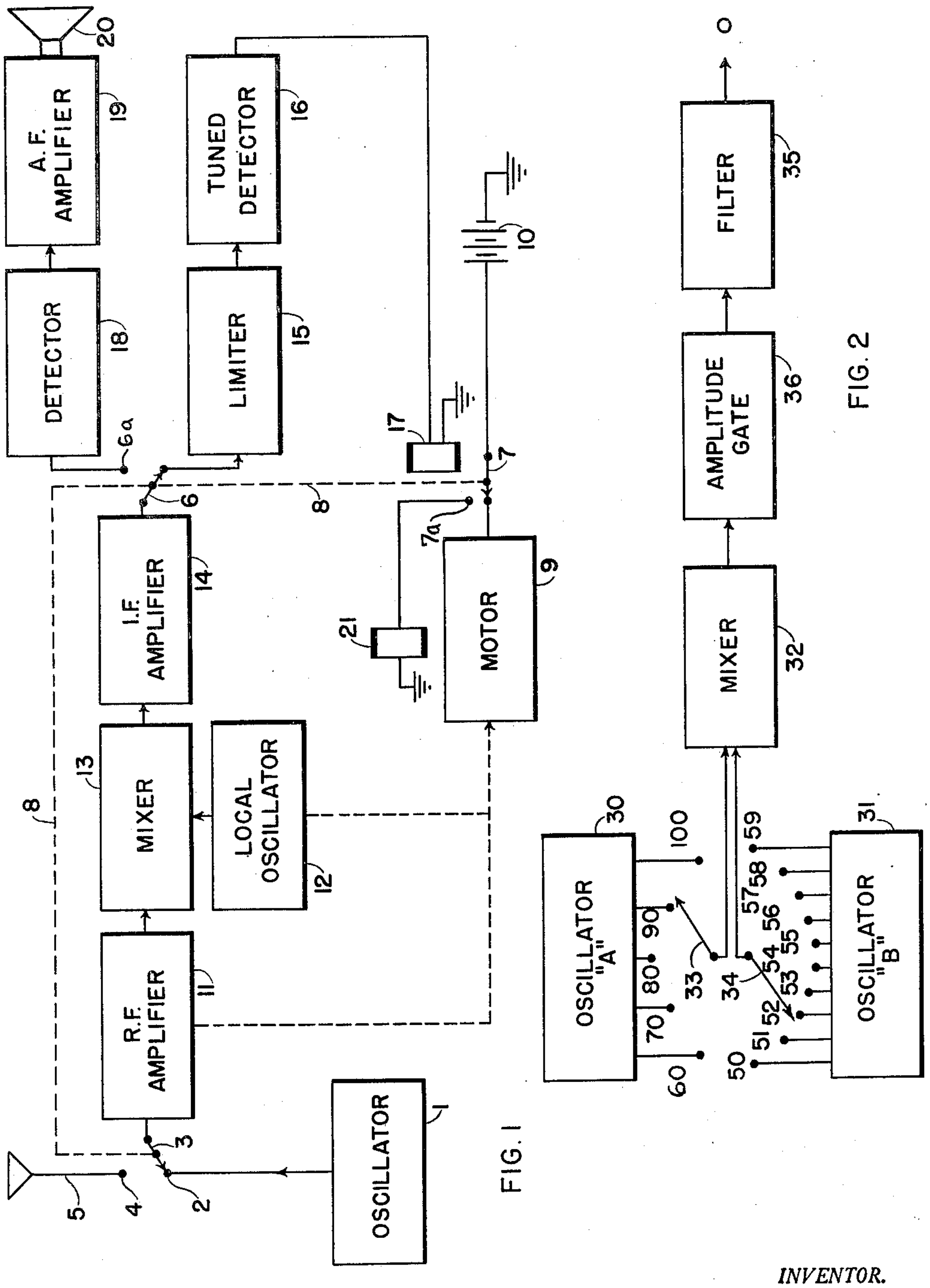

The present invention relates generally to positioning means and more particularly to positioning means adapted for selective tuning of radio equipment.

It is an object of the invention to provide positioning means of a novel character, and which shall be capable of rapidly actuating a positionable device to have a preselected position.

It is another object of the invention to provide a tuning system capable of rapid automatic adjustment to any one of a large number of predetermined frequencies.

It is still another object of the invention to provide a tuning system for radio receivers comprising a decade system of frequency selection.

It is a further object of the invention to provide a tuning system for radio receivers and the like, which utilizes a signal generator for selectively setting up frequencies to which the receiver is to be tuned, and which utilizes a motor driven scanning device for discovering the said frequencies.

It is still a further object of the invention to provide a signal generator, which may be utilized in the system of the invention, and which provides output frequencies having discrete selectable values over a wide frequency spectrum.

The above and still further objects and advantages of the invention will become evident upon study of the following description of a specific embodiment of the invention. In this connection reference is made to the accompanying drawings, wherein:

Figure 1 is a block circuit diagram of a tuning system constructed in accordance with the present invention, and shown as applied to a radio receiver; and Figure 2 is a block circuit diagram of a signal generator capable of utilization in conjunction with the present invention.

In general I provide a system of electrical tuning in which a mechanically positionable tuning element of a tunable device, such as a variable condenser or a variable inductance, is positioned by a suitable motor to tune the device to a frequency corresponding with the output frequency of a signal generator.

I provide a signal generator capable of providing a large number of discrete frequencies, in response to operation of a plurality of selective switches, each of the said switches being operable to select one frequency of one of a plurality of series of frequencies, and the frequencies of each series increasing arithmetically in value in accordance with a different law. The switches may be positioned by a simple manual operation of rotation, in the event multiple contact rotary switches are employed; or, push-button switching may be resorted to; or, still further, positioning may be accomplished by means of an impulser of the type now commonly employed in telephone practice. In particular, and for purposes of illustration only, I may utilize one oscillator capable of providing a series of selectable frequencies differing in value from one another by 10 mc. increments, and a further oscillator capable of providing a series of selectable frequencies differing in value from one another by 1 mc. increments. By mixing the outputs of the oscillators in a suitable heterodyne converter, a series of frequencies may be provided increasing in increments of 1 mc. over a spectrum measured in many tens of megacycles.

The device which is to be tuned in accordance with the system of my invention may be a radio receiver of conventional character, in general, and may, for purposes of exemplification only, be tunable by means of a variable condenser, in conventional fashion. The condenser itself may be positioned by means of a drive motor coupled thereto, and which is controlled in a manner well known per se in the art of automatic frequency control, in response to the output of a frequency discriminator or tuned circuit.

More specifically, and referring now to Figure 1 of the accompanying drawings, the numeral 1 refers to a manually adjustable oscillator, capable of being controlled to produce signals at any one of a large number of discrete frequencies. While the system as illustrated in Figure 1 of the drawings, and hereinafter described in detail, requires no specific type of oscillator, and may be operated in conjunction with any source of signal having sufficient amplitude, nevertheless, I have disclosed in Figure 2 an oscillator which I prefer to utilize in the practice of the invention, and which has the advantage of convenience and ease of adjustment when so utilized.

The oscillator 1 is connected to a switch terminal 2, which may be selected by a switch arm 3, the latter being manually operable to contact terminal 2, and, as will be hereinafter described, being relay actuated at the conclusion of a tuning operation to contact with a terminal 4 which is connected to a source of signals, such as an antenna 5.

Ganged with the switch arm 3 are further switch arms 6 and 7, all of which operate together in the cycle of operation of the present invention, mechanical ganging being indicated by the dash lines 8. At least one of the switch arms 3, 6, 7 is required to be of the two-position snap switch type, tending to remain in the last position to which it may have been actuated until transferred to an alternative position by the application of sufficient force.

Upon closure of switch 3, the switch 7 is also closed providing a power circuit for the motor 9 from the source of power 10, conventionally illustrated as a battery for the sake of simplicity. The motor 9 thereupon commences to rotate, driving the tuning elements of the R. F. amplifier 11 and the local oscillator 12. Rotation of the motor 9 causes continuous tuning of the R. F. amplifier 11 and the local oscillator 12, from one end of the range thereof to the other, suitable limit switches (not illustrated) being provided to cause reversal of the direction of motor rotation at each limit of the tuning range.

As the amplifier 11 and the local oscillator 12 are tuned through their range they eventually discover the signal derived from the oscillator 1, causing translation of same, in the mixer 13, to a frequency transferable by the I. F. amplifier 14. The switch 6 transfers signals derived from the I. F. amplifier 14 to a limiter 15, which in turn provides signal for a frequency discriminator 16 which may comprise a simple resonant or tuned detector circuit, tuned to the center of the pass band of the I. F. amplifier 14, and adjusted to provide maximum current at its output as the signal input thereto passes through the central frequency of the I. F. pass band. A relay 17 is provided at the output of the discriminator or tuned detector 16, which is adapted and arranged to actuate the switches 3, 6, 7 only during the maximum current values available from the discriminator or tuned detector 16.

By suitable design of the switches 3, 6, 7 and of the relay 17 in relation to the electrical constants of the discriminator or tuned detector 16 and of the limiter 15, it is thus possible to open the circuit of the motor 9 upon tuning of the receiver of the invention to the precise frequency provided by the oscillator 1.

Actuation of switch arms 3, 6, 7 in response to relay 17 transfers switch arm 3 to contact 4, which is connected with antenna 5; and switch arm 6 into contact with contact 6*a*, which transfers the output of the I. F. amplifier 14 to a suitable audio detector 18, the output of which may be amplified by and A. F. amplifier 19 and thence applied to an output translating device 20, such as a loud speaker, a pair of headphones, a recorder or other similar device.

Various expedients may be resorted to in order to prevent overrunning of the motor 9 due to its own inertia, after opening of the switch 7. I prefer, however, to provide a relay operated brake mechanism, conventionally indicated by the relay 21, and which when energized stops the rotation of the motor 9 practically instantaneously. The structure of such brakes is old and well known per se, and for that reason detailed illustration and exposition thereof is dispensed with. The brake relay 21 may be connected to contact 7*a* for connection to power source 10 upon operation of switch arm 7 by relay 17.

It will be clear that the discriminator or tuned circuit 16 may have a narrow pass band, if desired, and thus provide for a sharp increase of current with change of frequency, and that its characteristics may be unrelated to those of the amplifier 14, except in respect to tuning, if desired. Thereby, should the I. F. amplifier have a relatively wide pass band, the discriminator or tuned circuit 16 may have comparatively a much sharper pass band, in order more closely and finely to control the tuning of the amplifier 11 and the local oscillator 12.

It has been previously recited that the oscillator 1 may be of any convenient character which is capable of providing signals over the range of frequency values and at the amplitudes desired. I have provided one specific type of oscillator, illustrated in Figure 2 of the drawings, and which may be utilized to advantage in the system of Figure 1, by reason of the ease with which may be selected any one of a plurality of discrete frequencies extending over an extremely wide frequency spectrum.

Referring now specifically to Figure 2 of the drawings, and bearing in mind that specific frequency values are referred to for purposes of example only and not by way of limitation on the true scope of the invention, there is provided an auxiliary oscillator A, to which is applied the reference numeral 30 and which provides five frequencies, separated by increments of 10 mc. and which, for example, may comprise a crystal controlled harmonic generator having a fundamental frequency of 10 mc. Signal sources of the above character are well known in the art, and require no detailed elucidation for their complete understading. There is further provided an auxiliary oscillator B, identified by the numeral 31, which provides selectively a plurality of signal outputs differing in frequency in increments of one mc., and which may be of the same general construction as generator A, the output frequencies being crystal controlled for accuracy by a 1 mc. crystal.

It is desired, in the presently described embodiment of my invention, to provide output frequencies in the range 1–49 mc. in one mc. steps or increments.

Upon sufficient consideration of the system which is illustrated in Figure 2 of the drawings, it will be clear that the absolute values of the frequencies selected for oscillators A and B may not be selected at random, since upon converting the outputs of the oscillators A and B in a mixer 32, it is essential that no more than a single product of the conversion be within the desired output range of frequencies for any combined settings of the oscillators A and B. Accordingly, I provide output frequencies of 60–100 mc. in 10 mc. increments by selective actuation of the switch arm 33 associated with the oscillator A, and frequencies of 50–59 mc. in 1 mc. increments by selective actuation of the switch arm 34 associated with the oscillator B. I provide at the output of the mixer 32 a low pass filter 35 which cuts off sharply between 49 and 50 mc.

It will be clear with the arrangement above described, and considering all the possible products of a frequency conversion, that but few possible ambiguities of output may occur in the described system. The fundamental and harmonic products of the outputs of each of oscillators A and B, present in the output of mixer 32, fall above the pass band of the filter 35. The sum frequencies generated in the mixer likewise all fall above the pass band of the filter. Differences of the fundamental frequencies generated by oscillators A and B fall within the pass band of filter and represent the useful output of the signal generator.

When possible higher order products of frequency conversion or mixing are considered, in analyzing the operation of the signal generator illustrated in Figure 2, it becomes apparent that ambiguities may be present in the output of the generator due to such higher order products. For example, were it desired to generate a frequency of 8 mc. in the output of the signal generator, oscillator A would be adjusted to produce an output frequency of 60 mc. and oscillator B of 52 mc., to provide a difference frequency of 8 mc. The second harmonic of 52 mc. would, however, combine with 60 mc. to provide a converter output component of 44 mc. It is well known that higher order products of frequency conversion are of relatively slight amplitude in comparison with first order products, and this fact enables discrimination between desired signals, and undesired high order conversion products. In order to eliminate undesirable higher order conversion products from the output of the mixer, I may provide an amplitude gate 36, adjusted to pass only conversion products having amplitudes approximately as great as are possessed by the desired conversion products derivable from mixer 32, thereby enabling discrimination between desired and undesired control signals.

The mixer 32, in the system of Figure 2 may be looked on as a device for subtracting from the output frequency of oscillator 30 the output frequency of oscillator 31. Hence, if oscillator 30 be arranged to provide 60 mc. the oscillator 31 may be caused to subtract therefrom values of 59, 58, 57, 56, 55, 54, 53, 52, 51 or 50 mc. selectively to produce mixer output products of 1, 2, 3, 4, 5, 6, 7, 8, 9, 10 mc. Upon increasing the output frequency of oscillator 30 to 70 mc. difference frequencies of 11 to 20 mc. may be obtained in 1 mc. steps. And for an output of 100 mc. from oscillator 30 the output frequency of the device is 41–50 mc., in steps of one mc.

It will, of course, be realized that the output of the system of Figure 2 may be selected at will to cover extremely wide bands of frequencies in steps of unitary character.

For example, were it desired to provide outputs of 1–99 mc. in 1 mc. increments the oscillator A might be designed, in accordance with the principles of the invention, to provide output frequencies of 110, 120, 130, 140, 150, 160, 170, 180, 190, 200 mc. The oscillator B on the other hand might be designed to provide output frequencies of 100, 101, 102, 103, 104, 105, 106, 107, 108, 109 mc. But slight reflection is required to demonstrate that the desired output band of 1–99 mc. may be thus obtained, without ambiguity of output, except as may be readily removed by an amplitude gate.

While I have described one specific embodiment of my invention it will be clear that various modifications of the arrangement specifically described and illustrated may be resorted to without departing from the spirit of the invention, as defined in the appended claims.

What I claim and desire to secure by Letters Patent of the United States is:

1. In combination, a signal generator, a circuit, a tunable signal translation device, means for selectively connecting said generator and said circuit to an input circuit of said signal translation device, means for modifying the tuning of said translation device rendered operative concurrently with connection of said translation device to said signal generator, and means operative in response to substantially identical tuning of said signal generator and of said translation device for disabling said means for modifying and for connecting said translation device to said circuit.

2. In combination, a tunable signal generator for providing selectively any one of a plurality of frequencies, a radio frequency signal receiving means comprising a radio frequency selector, a mixer, a local oscillator and an intermediate frequency amplifier, means for applying to said mixer signals derived from said selector and from said local oscillator for heterodyning in said mixer, means for applying heterodyned output signals from said mixer to said intermediate frequency amplifier for amplification of said output signals therein, motor means for tuning said local oscillator, means responsive to said output signals for disabling said motor means, a terminal, means normally connecting said signal generator with said radio frequency selector to apply signals to said radio frequency selector, and means responsive to said output signals for disconnecting said radio frequency selector from said signal generator and for connecting said radio frequency selector with said terminal.

3. In combination, a tunable signal receiving channel, a signal translator for translating signals received by said signal receiving channel, a signal detector for detecting signals received by said signal receiving channel, a terminal, a tunable oscillator, motor means for continuously tuning said tunable signal receiving channel in a frequency scannnig operation, means operative for connecting said tunable signal receiving channel simultaneously with said signal detector and with said tunable oscillator and for enabling tuning operation of said motor means for continuously tuning said tunable signal receiving channel, means responsive to attainment of frequency coincidence between the tuning of said signal receiving channel and the frequency of said tunable oscillator for disabling said motor means, for disconnecting said tunable oscillator and said signal detector from said tunable signal receiving channel, and for connecting said tunable signal receiving channel with said terminal and with said signal translator.

4. In combination, a tunable signal receiving channel tunable over a predetermined range of frequencies, signal translating means for translating signals received by said signal receiving channel, signal detector means for detecting signals received by said signal receiving channel, a terminal, a tunable oscillator for providing a signal at a frequency within said predetermined range of frequencies, motor means for continuously tuning said tunable signal receiving channel in a frequency scanning operation within said predetermined range of frequencies, means operative for connecting said tunable signal receiving channel simultaneously with said signal detector and with said tunable oscillator, and for enabling tuning operation of said motor means for continuously tuning said tunable signal receiving channel over said predetermined range of frequencies, means responsive to attainment of frequency coincidence between the tuning of said signal receiving channel and the frequency of said tunable oscillator for disabling said motor means, and for disconnecting said tunable oscillator and said signal detector from said tunable signal receiving channel, and for coupling said tunable receiving channel with said terminal and with said signal translating means.

5. In combination, a tunable signal receiving channel, a signal translator for translating signals received by said signal receiving channel, a signal detector for detecting signals received by said signal receiving channel, an input circuit, a tunable oscillator, motor means for continuously tuning said tunable signal receiving channel in a frequency scanning operation through a range of frequencies including the frequency of said tunable signal oscillator, means for connecting said signal receiving channel with said tunable oscillator, means responsive to connection of said tunable oscillator with said tunable signal receiving channel for simultaneously energizing said motor means for initiating a frequency scanning operation of said tunable signal receiving channel and for connecting said signal detector with said tunable signal receiving channel, means responsive to signal output from said signal detector upon attainment of frequency coincidence between the tuning of said signal receiving channel and the frequency of said tunable oscillator for de-energizing said motor means, for disconnecting said tunable oscillator and said signal detector from said tunable signal receiving channel and for connecting said tunable signal receiving channel with said input circuit and with said signal translator.

6. In combination, a tunable signal receiving channel, a signal translator for translating signals received by said signal receiving channel, a signal detector for detecting signals received by said signal receiving channel, an input circuit, a tunable oscillator, electric motor means for continuously tuning said tunable signal receiving channel in a frequency scanning operation over a range of frequencies including the frequency of said tunable oscillator, a source of electrical energy for said electric motor means, a plurality of mechanically interlocked switch means for selectively either connecting said tunable signal receiving channel with said signal detector and with said tunable oscillator and said motor means with said source of energy for said motor means or for connecting said tunable signal receiving channel with said input circuit and with said signal translator and for disconnecting said motor means from said source of energy, and means responsive to signals in said signal detector for actuating said switch means for connecting said tunable receiving channel with said input circuit.

7. In combination, a radio receiver tunable over a predetermined band of frequencies, normally inoperative motor means for tuning said tunable radio receiver over said predetermined band of frequencies, a signal generator for supplying a signal at a frequency within said predetermined band of frequencies, means for rendering said motor means operative, means for connecting said signal generator in signal applying relation to said tunable radio receiver in response to rendering operative of said motor means, a terminal for said radio receiver, and means responsive to attainment of frequency coincidence of the tuning of said tunable radio receiver with the frequency of said signal generator for rendering inoperative said motor means and for simultaneously disconnecting said tunable radio receiver from said signal generator and for connecting said terminal with said tunable radio receiver.

8. In combination, a tunable signal receiver, a tunable signal oscillator, a radio signal input circuit, first switch means for selectively connecting said tunable signal receiver with said signal generator and with said input circuit, a signal translator, a signal detector, second switch means for selectively connecting an output circuit of said tunable radio receiver with said translator and with said signal detector, motor means for tuning said tunable radio receiver over a band of frequencies, a source of energy for said motor means, third switch means for selectively connecting and disconnecting said motor means from said source of energy, means for simultaneously actuating said first, second and third switch means for connecting said signal generator and said signal detector with said tunable signal receiver and said motor means with said source of energy, means responsive to the presence of signals in said signal detector actuating said first, second and third switch means for disconnecting said motor means from said source of energy, and for simultaneously connecting said tunable signal receiver with said input circuit and with said signal translator.

9. In combination, a tunable receiving channel, a signal translator for translating signals received by said tunable receiving channel, a signal detector for detecting signals received by said signal receiving channel, a terminal, a tunable oscillator, electric motor means for continuously tuning said tunable signal receiving channel in a frequency scanning operation over a predetermined band of frequencies, means for tuning said tunable oscillator to a frequency within said predetermined band of frequencies, a source of energy for said electric motor means, switch means operative for connecting said tunable signal receiving channel simultaneously with said signal detector and with said tunable oscillator, and for connecting said electric motor means with said source of electric energy for said electric motor means to enable a tuning operation of said tunable signal receiving channel, breaking means for said electric motor means operative to brake said motor means in response to application of electric energy to said braking means, means responsive to attainment of frequency coincidence between the tuning of said signal receiving channel and the frequence of said tunable oscillator for disconnecting said electric motor means from said source of electric energy and for connecting said braking means with said source of energy, for disconnecting said tunable oscillator and said tunable detector from said tunable signal receiving channel, and for connecting said tunable receiving channel with said terminal and with said signal translator.

10. In combination, a tunable signal receiving channel, a signal translator for translating signals received by said signal receiving channel, a signal detector for detecting signals received by said signal receiving channel, a circuit, a tunable oscillator, motor means for continuously tuning said tunable signal receiving channel in a frequency scanning operation, means operative for connecting said tunable signal receiving channel simultaneously with said signal detector and with said tunable oscillator and for enabling tuning operation of said motor means for continuously tuning said tunable signal receiving channel, means responsive to attainment of frequency coincidence between the tuning of said signal receiving channel and the frequency of said tunable oscillator for disabling said motor means, said means responsive to attainment of frequency coincidence comprising a single relay connected in circuit with said signal detector for energization thereby, and means responsive to energization of said relay for disconnecting said tunable oscillator and said signal detector from said tunable signal receiving channel, and for connecting said tunable signal receiving channel with said circuit and with said signal translator.

11. In combination, a radio frequency receiver, an antenna for intercepting signals for application to said tunable receiver, a tunable signal generator for applying signals of selected frequency to said tunable radio receiver, a first two position selective switch for connecting said antenna with said tunable receiver in a first position of said first two position selective switch and for connecting said oscillator with said radio receiver in a second position of said first two position selective switch, a signal detector, a second two position selective switch for connecting said signal translator with said radio receiver in a first position of said second two position selective switch and for connecting said signal detector with said receiver in a second position of said second two position selective switch, an electric motor for tuning said tunable radio receiver over a predetermined band of frequencies when energized, a source of electric energy for said electric motor, a third two position selective switch for selectively disconnecting said motor from said source of energy in a first position of said third two position selective switch and for connecting said motor with said source of energy in a second position of said third two position selective switch, means for actuating said first, second and third two position selective switches simultaneously to said second positions of said first, second and third two position switches, and a single relay coil responsive to signal output from said signal detector for actuating said first, second and third two position selective switches to said first positions of said first, second and third two position selective switches.

12. In combination, a tunable signal receiving channel having a predetermined band pass characteristic, a signal translator for translating signals received by said signal receiving channel, a signal detector for detecting signals received by said receiving channel, said signal detector comprising a signal amplitude limiter and a frequency discriminator for providing maximum output when signals received by said signal receiving channel occupy a frequency position centrally of said pass band, an input circuit, a tunable oscillator, motor means for continuously tuning said tunable signal receiving channel in a frequency scanning operation, means operative for connecting said tunable signal receiving channel simultaneously with said signal detector and with said tunable oscillator and for enabling tuning operation of said motor means for continuously tuning said tunable signal receiving channel, means responsive only to attainment of maximum output from said frequency discriminator during frequency coincidence between the tuning of said signal receiving channel and the frequency of said tunable oscillator for disabling said motor means, for disconnecting said tunable oscillator and said signal detector from said tunable signal receiving channel, and for connecting said tunable signal receiving channel with said input circuit and with said signal translator.

13. In combination, a tunable signal receiving channel tunable over a predetermined range of frequencies, signal translating means for translating signals received by said signal receiving channels, signal detector means for detecting the presence of signals centrally of the pass band of said signal receiving channel, an input circuit, a tunable oscillator for providing a signal at a frequency within said predetermined range of frequencies, motor means for continuously tuning said tunable signal receiving channel in a frequency scanning operation within said predetermined range of frequencies, means operative for connecting said tunable signal receiving channel simultaneously with said signal detector and with said tunable oscillator, and for enabling tuning operation of said motor means for continuously tuning said tunable signal receiving channel over said predetermined range of frequencies, means responsive to attainment of signal output from said signal detector means in response to frequency coincidence between the frequency of said tunable oscillator and the center frequency of said pass band of said tunable signal receiving channel for disabling said motor means, and for disconnecting said tunable oscillator and said signal detector from said tunable signal receiving channel, and for coupling said tunable receiving channel with said input circuit and with said signal translating means.

14. In combination, a tunable signal receiving channel having a predetermined band pass characteristic, a signal translator for translating signals received by said signal receiving channel, a signal detector for detecting signals received by said signal receiving channel and for a providing maximum output of predetermined amplitude upon coincidence of said signals with the center of said band pass characteristic, an input circuit, a tunable oscillator, motor means for continuously tuning said signal receiving channel in a frequency scanning operation through a range of frequencies including the frequency of said tunable signal oscillator, means for connecting said signal receiving channel with said tunable oscillator, means responsive to connection of said tunable oscillator with said tunable receiving channel for simultaneously energizing said motor means for initiating a frequency scanning operation of said tunable signal receiving channel and for connecting said signal detector with said tunable signal receiving channel, means responsive only to maximum signal output from said signal detector upon attainment of frequency coincidence between the tuning of the frequency of said tunable oscillator with the center frequency of said predetermined band pass characteristic of said signal receiving channel for de-energizing said motor means, for disconnecting said tunable oscillator and said signal detector from said tunable signal receiving channel and for connecting said tunable signal receiving channel with said input circuit and with said signal translator.

15. In combination, a receiver tunable over a predetermined band of frequencies and having a predetermined band pass characteristic, normally inoperative motor means for tuning said tunable receiver over said predetermined band of frequencies, a signal generator for providing a signal at a frequency within said predetermined band of frequencies, means for rendering said motor means operative, means for connecting said signal generator in signal applying relation to said tunable radio receiver in response to rendering operative of said motor means, an input circuit for said radio receiver, and means responsive to attainment of frequency coincidence of said predetermined band pass characteristic of said tunable receiver with the frequency of said signal generator for rendering inoperative said motor means and for simultaneously disconnecting said tunable receiver from said signal generator and for connecting said input circuit with said tunable radio receiver.

MARCEL WALLACE.

REFERENCES CITED

The following references are of record in the file of this patent:

UNITED STATES PATENTS

| Number | Name | Date |
|---|---|---|
| 2,011,953 | Somers | Aug. 30, 1935 |
| 2,182,352 | Prochnow | Dec. 5, 1939 |
| 2,240,450 | Wolfskill | Apr. 29, 1941 |
| 2,262,766 | Jansson | Nov. 18, 1941 |
| 2,380,868 | Peterson | July 31, 1945 |
| 2,382,203 | Chandler | Aug. 14, 1945 |